(12) United States Patent
Hellar et al.

(10) Patent No.: US 12,016,156 B2
(45) Date of Patent: Jun. 18, 2024

(54) MIL-AERO CONDUCTION COOLING CHASSIS

(71) Applicant: The Boeing Company, Chicago, IL (US)

(72) Inventors: Taylor Brandon Hellar, St. Peters, MO (US); George N. Theodorou, St. Louis, MO (US)

(73) Assignee: The Boeing Company, Chicago, IL (US)

( * ) Notice: Subject to any disclaimer, the term of this patent is extended or adjusted under 35 U.S.C. 154(b) by 84 days.

(21) Appl. No.: 17/514,459

(22) Filed: Oct. 29, 2021

(65) Prior Publication Data

US 2023/0139714 A1    May 4, 2023

(51) Int. Cl.
*H05K 7/20* (2006.01)

(52) U.S. Cl.
CPC ..... *H05K 7/20409* (2013.01); *H05K 7/20336* (2013.01)

(58) Field of Classification Search
CPC ........... H05K 7/20409; H05K 7/20336; H05K 7/20681; H05K 7/20509; H05K 7/20145; G06F 1/20; F28D 15/0266; F28D 15/0275; F28F 1/30; F28F 1/32
See application file for complete search history.

(56) References Cited

U.S. PATENT DOCUMENTS

| | | | |
|---|---|---|---|
| 6,675,887 B2 * | 1/2004 | Garner | F28D 15/06 165/274 |
| 11,051,431 B2 * | 6/2021 | Marcoccia | F28D 15/0275 |
| 2003/0183381 A1 * | 10/2003 | Garner | F28D 15/06 165/274 |
| 2006/0279926 A1 * | 12/2006 | Koo | G06F 1/20 361/689 |
| 2007/0234740 A1 * | 10/2007 | Lee | H01L 23/427 257/E23.099 |
| 2009/0294117 A1 * | 12/2009 | Hodes | H01L 23/427 165/104.34 |
| 2010/0051240 A1 * | 3/2010 | Ipposhi | F28D 15/06 165/104.26 |
| 2010/0051254 A1 * | 3/2010 | Ipposhi | F28F 13/14 165/274 |
| 2013/0186608 A1 * | 7/2013 | Liu | F28D 15/0233 165/181 |
| 2016/0360641 A1 | 12/2016 | Fujii et al. | |
| 2020/0100388 A1 | 3/2020 | Hernandez-Toledo | |
| 2021/0108860 A1 * | 4/2021 | Kulkarni | F28D 15/0275 |

FOREIGN PATENT DOCUMENTS

EP       3629690 A1    4/2020

OTHER PUBLICATIONS

European Search Report for application No. EP 22184719.7 dated Jan. 9, 2023.

* cited by examiner

*Primary Examiner* — Abhishek M Rathod
(74) *Attorney, Agent, or Firm* — Jordan IP Law, LLC

(57) ABSTRACT

A heat frame and a processing device are provided. The heat frame includes a plurality of fins and at least one heat pipe extending through a hole provided in each of the plurality of fins. The heat frame is coupled to a cooling chassis. The processing device includes a processing module, a first heat frame, and a second heat frame.

20 Claims, 11 Drawing Sheets

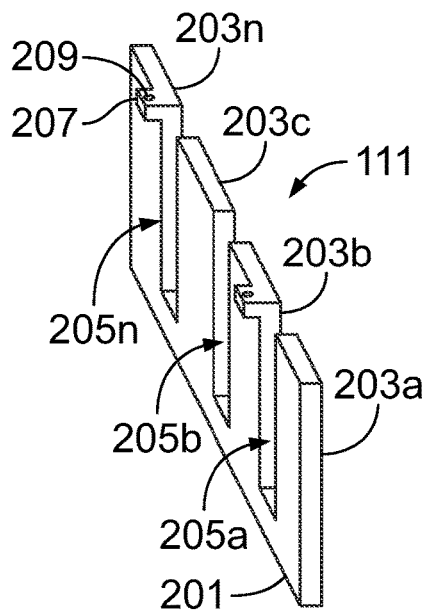
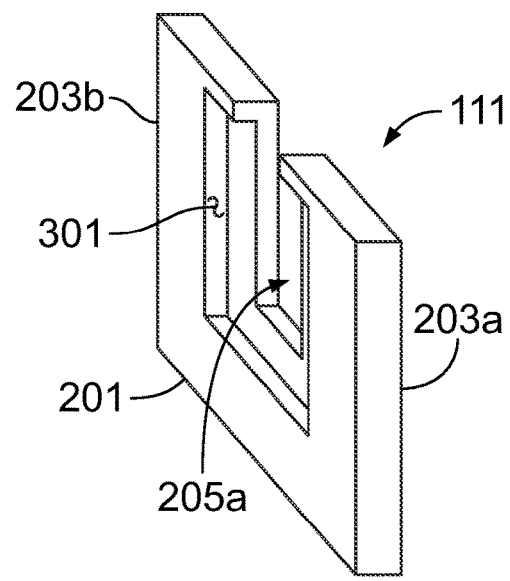
FIG. 2
FIG. 3
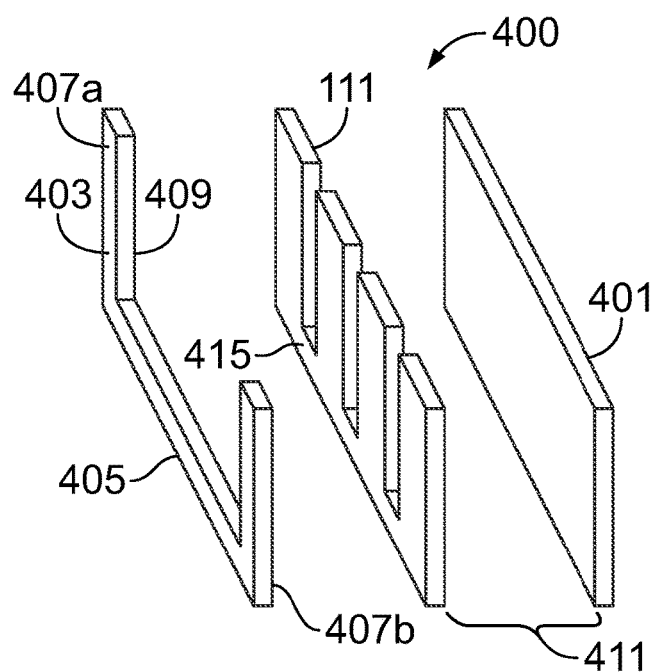
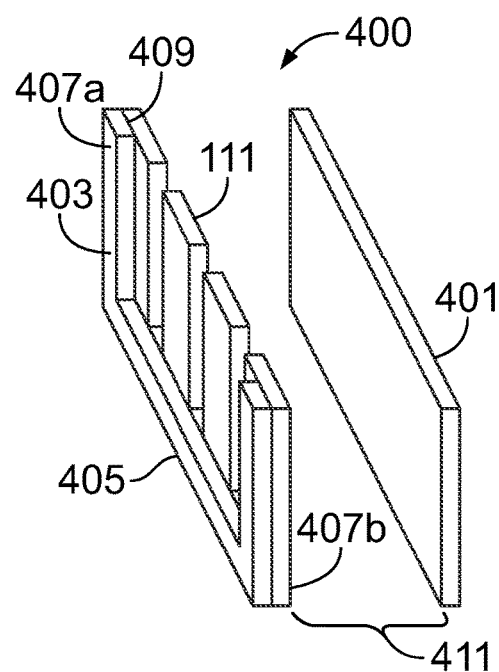
FIG. 4A
FIG. 4B

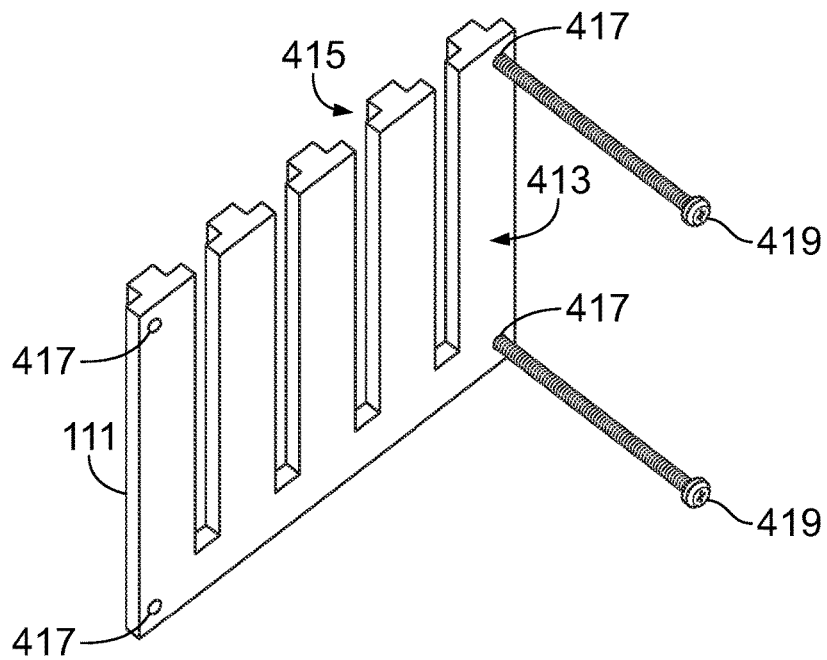
FIG. 4C
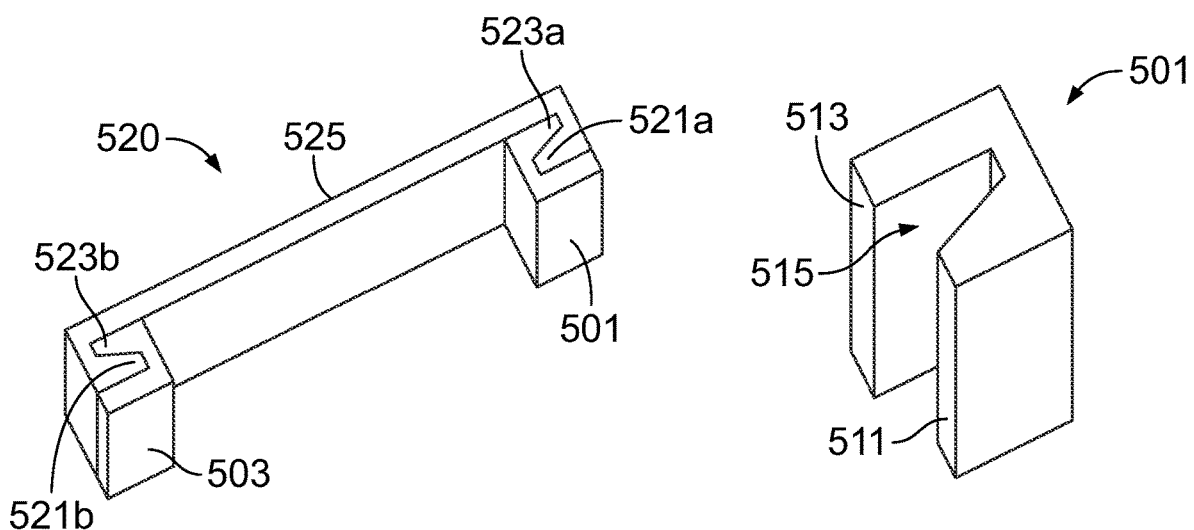
FIG. 5A
FIG. 5B

MIL-AERO CONDUCTION COOLING CHASSIS

BACKGROUND

Current iterations of electronic devices include various high power processing modules, for example central processing units, graphics processing units, field programmable gate array processing units, and so forth. These high power processing modules generate heat when executing, and therefore require cooling systems that maintain the temperature of the processing power modules within an acceptable range.

Current methods of cooling include direct forced air cooling, liquid cooling, and conduction cooling. Direct forced air cooling across module circuit cards is not feasible in tactical platforms due to the risk of sand, dust, or other contaminants that could damage or destroy the electronic components. Liquid cooling is effective but hampered by high costs and design complexity. Liquid cooling is also prone to leaks and mechanical development challenges associated with designing and testing the internal fluid transfer paths. Conduction air cooling is economical and efficient for medium-sized tactical applications, but has critical limitations when it comes to cooling high-powered modules. Thermal models, test data, and deployed system thermal qualification test results have shown that traditional VPX conduction cooling hits an upper bound as the module power approaches sixty to seventy watts.

SUMMARY

The disclosed examples are described in detail below with reference to the accompanying drawing figures and listed below. The following summary is provided to illustrate examples or implementations disclosed herein. It is not meant, however, to limit all examples to any particular configuration or sequence of operations.

In one implementation, a heat frame is provided. The heat frame comprises a plurality of fins and at least one heat pipe extending through a hole provided in each of the plurality of fins. The heat frame is coupled to a cooling chassis.

In another implementation, a processing device is provided. The processing device includes a processing module, a first heat frame coupled to a first side of the processing module, and a second heat frame coupled to a second side of the processing module. Each of the first heat frame and the second heat frames comprises a plurality of fins, each fin of the plurality of fins including at least one hole. Each fin of the plurality of fins is parallel to every other fin; and at least one heat pipe extending through the hole provided in each of the plurality of fins.

In another implementation, a conduction cooling chassis is provided. The conduction cooling chassis includes a processing device, a first cooling chassis, and a second cooling chassis. The processing device includes a first heat frame, a second heat frame, and a processing module provided between the first heat frame and the second heat frame. Each of the first cooling chassis and the second cooling chassis includes a first wall, a second wall, and a slot provided between the first wall and the second wall. A junction between the first heat frame and the processing module is provided in the slot of the first cooling chassis and a junction between the second heat frame and the processing module is provided in the slot of the second cooling chassis.

Other technical features may be readily apparent to one skilled in the art from the following figures, descriptions, and claims.

BRIEF DESCRIPTION OF THE DRAWINGS

For a more complete understanding of the present disclosure and its advantages, reference is now made to the following description taken in conjunction with the accompanying drawings, in which like reference numerals represent like parts:

FIG. 2 illustrates a perspective view of a cooling chassis according to various implementations of the present disclosure;

FIG. 3 illustrates a magnified, perspective view of a cooling chassis according to various implementations of the present disclosure;

FIG. 4A illustrates an exploded view of a cooling chassis assembly according to various implementations of the present disclosure;

FIG. 4B illustrates a rear perspective view of a cooling chassis assembly according to various implementations of the present disclosure;

FIG. 4C illustrates a front perspective view of the cooling chassis according to various implementations of the present disclosure;

FIG. 5A illustrates a perspective view of a rail clamp assembly according to various implementations of the present disclosure;

FIG. 5B illustrates a magnified, perspective view of a rail clamp according to various implementations of the present disclosure;

Corresponding reference characters indicate corresponding parts throughout the accompanying drawings.

DETAILED DESCRIPTION

Figure 1:
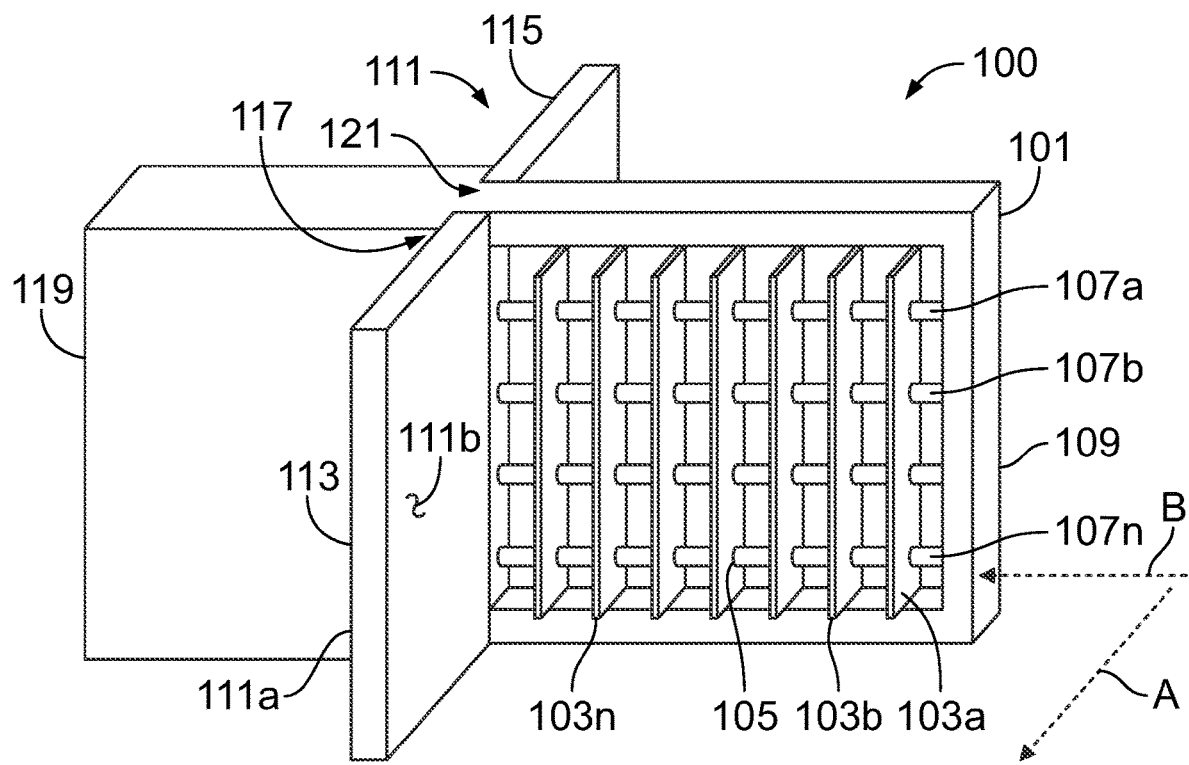
FIG. 1 illustrates a perspective view of a processing device according to various implementations of the present disclosure.

The various examples will be described in detail with reference to the accompanying drawings. Wherever possible, the same reference numbers will be used throughout the drawings to refer to the same or like parts. References made throughout this disclosure relating to specific examples and implementations are provided solely for illustrative purposes but, unless indicated to the contrary, are not meant to limit all implementations.

The foregoing summary, as well as the following detailed description of certain implementations will be better understood when read in conjunction with the appended drawings. As used herein, an element or step recited in the singular and preceded by the word "a" or "an" should be understood as not necessarily excluding the plural of the elements or steps. Further, references to an implementation or an example are not intended to be interpreted as excluding the existence of additional examples that also incorporate the recited features. Moreover, unless explicitly stated to the contrary, examples "comprising" or "having" an element or a plurality of elements having a particular property could include additional elements not having that property.

As referenced herein, conduction cooling refers to the cooling of a processing module by transferring heat from a heated processing module to a cooled plurality of heat pipes, fins, and heat transfer frame, thereby cooling the processing module. The conduction cooling can take place in a conduction cooling chassis, for example a mil-aero conduction cooling chassis. As referenced herein, a mil-aero conduction cooling chassis is a conduction cooling chassis that meets military and aerospace standards, which are typically more strict and rigorous than conventional standards.

As referenced herein, the existing solutions for cooling chassis methodologies each have advantages and disadvantages. Aspects of the present disclosure provide systems and methods that facilitate an air-cooled method for higher-powered module and enable the transition of expensive, liquid cooled architectures into an air-cooled design. The approach of the air-conduction-cooled chassis and module heat frame design presented herein overcomes the thermal limitations that are inherent in high-power, conduction cooled VPX processing modules. In some implementations, the chassis design specifically enables extensive module heat frame customization and flexibility, which enables high-powered modules to implement more exotic and/or optimized heat transfer solutions.

Aspects of the disclosure recognize and take into account that thermal conductivity is highest with non-structural devices, for example heat pipes and vapor chambers. Heat pipes and vapor chambers have higher thermal conductivity than solid metal by orders of magnitude. However, the junction between the module heat frame and the cooling chassis interface is required to absorb shock, vibration, and clamping pressure. Accordingly, non-structural heat transfer features are integrated as part of the solid heat frame structure. In other words, clamping and/or applying any form of structural pressure to heat pipes or vapor chambers would cause the heat pipes to collapse and fail. Therefore, alternative solutions are required.

Advanced cooling techniques are enabled by providing the heat frame edge direct access to the air stream. High-heat sources can dissipate heat into the air stream without first traversing through multiple inefficient thermal interfaces. Heat pipes, vapor chambers, and novel fin designs are all potential thermal solutions. The solution provided herein removes heat directly from the high-power heat source, i.e., the processing module, which typically contains a field-programmable gate array (FPGA), central processing unit (CPU), or graphics processing unit (GPU).

For example, embedded heat pipes are a straightforward method for moving large heat loads. Slot openings in the moveable cooling wall were specifically designed to enable this type of thermal solution. Embedded heat pipes can extend from directly on top of the highest-power source, e.g., a GPU, a CPU, etc., through the heat frame edge, and into the thermally dissipating structure of one or more parallel fins. Furthermore, a cooling solution, e.g., the one or more heat pipes, improve performance due to their inherently high thermal conductivity and weight savings, due to the pipe structure.

FIG. 1 illustrates a perspective view of a processing device according to various implementations of the present disclosure. The example of the processing device 100 is presented for illustration only and should not be construed as limiting. Other implementations may be used without departing from the scope of the present disclosure. For example, the present disclosure contemplates one or more processing devices having different shapes, sizes, configurations, and so forth.

The processing device 100 includes a heat frame 101, a cooling chassis 111, and a processing module 119. The heat frame 101 includes a plurality of fins 103*a*, 103*b*, 103*n* and at least one heat pipe 107. In some implementations, as illustrated in FIG. 1, the heat frame 101 includes a plurality of heat pipes 107*a*, 107*b*, 107*n*. Each fin of the plurality of fins 103*a*, 103*b*, 103*n* includes at least one hole 105 through which a heat pipe of the plurality of heat pipes 107*a*, 107*b*, 107*n* extends. Each of the at least one holes 105 provided in each fin of the plurality of fins 103*a*, 103*b*, 103*n* are aligned such that each individual heat pipe 107 passes through a separate hole in each of the plurality of fins 103*a*, 103*b*, 103*n*. In some implementations, a single fin 103 of the plurality of fins 103*a*, 103*b*, 103*n* includes a plurality of holes 105 in order for multiple heat pipes 107*a*, 107*b*, 107*n* to extend through.

In some implementations, each of the plurality of fins 103*a*, 103*b*, 103*n* are bonded to each of the plurality of heat pipes 107*a*, 107*n*, 107*n*. For example, each of the plurality of heat pipes 107*a*, 107*n*, 107*n* can be thermally bonded to each of the plurality of fins 103*a*, 103*b*, 103*n*. The plurality of heat pipes 107*a*, 107*n*, 107*n* can be thermally cooled via a forced air surface of the bonded plurality of fins 103*a*, 103*b*, 103*n*.

The heat frame 101 further includes a frame 109 that supports the plurality of fins 103*a*, 103*b*, 103*n* and the plurality of heat pipes 107*a*, 107*b*, 107*n*. In some implementations, the frame 109 and the plurality of fins 103*a*, 103*b*, 103*n* are comprised of the same material. In other implementations, the frame 109 and the plurality of fins 103*a*, 103*b*, 103*n* are comprised of different materials. In some implementations, the frame 109 and the plurality of fins 103*a*, 103*b*, 103*n* are comprised of copper, which provides high thermal conductivity properties. In some implementations, the frame 109 and the plurality of fins 103*a*, 103*b*, 103*n* are comprised of aluminum, which provides weight savings over copper. In some implementations, the frame 109 and the plurality of fins 103*a*, 103*b*, 103*n* are comprised of a mixture of copper and aluminum.

In some implementations, each of the plurality of heat pipes 107*a*, 107*b*, 107*n* are comprised of the same material as one or both of the frame 109 and the plurality of fins 103*a*, 103*b*, 103*n*. In some implementations, each of the plurality of heat pipes 107*a*, 107*b*, 107*n* is comprised of copper. In some implementations, each of the plurality of heat pipes 107*a*, 107*b*, 107*n* is comprised of aluminum. In some implementations, each of the plurality of heat pipes 107a, 107b, 107n is comprised of a mixture of copper and aluminum.

In some implementations, the plurality of heat pipes 107a, 107b, 107n conduct heat from one area to another. The plurality of fins 103a, 103b, 103n provide both expanded surface area for heat dissipation and support for the plurality of heat pipes 107a, 107b, 107n. The plurality of fins 103a, 103b, 103n can be provided in any suitable arrangement relative to the plurality of heat pipes 107a, 107b, 107n. In the particular implementation illustrated in FIG. 1, the plurality of fins 103a, 103b, 103n extend from the frame 109 in a first direction A parallel to the cooling chassis 111 and each of the plurality of heat pipes 107a, 107b, 107n is provided in a second direction B perpendicular, or substantially perpendicular, to the first direction A. In other words, each of the plurality of heat pipes 107a, 107b, 107n is perpendicular to each of the plurality of fins 103a, 103b, 103n. However, this implementation should not be construed as limiting. Various implementations are possible. In some implementations, each of the plurality of heat pipes 107a, 107b, 107n is parallel to each of the plurality of fins 103a, 103b, 103n and the cooling chassis 111. In some implementations, some of the plurality of heat pipes 107a, 107b, 107n are parallel to the plurality of fins 103a, 103b, 103n and the cooling chassis 111 while other heat pipes of the plurality of heat pipes 107a, 107b, 107n are perpendicular to the plurality of fins 103a, 103b, 103n and the cooling chassis 111.

Each of the plurality of heat pipes 107a, 107b, 107n is configured with an internal wick structure and a working fluid that is used for cooling the processing module 119. In some implementations, the wick structure includes one or more of titanium, sintered copper, a screen, a hybrid, or specialty sintered or grooved. In some implementations, the working fluid includes one or more of water, ammonia, ethane, propylene, or any other suitable material. As cold or cooled air flows through the heat frame 101, for example in the first direction A, the heated, vaporized, working fluid in the plurality of heat pipes 107a, 107b, 107n is cooled, returning the working fluid to liquid form. In liquid form, the working fluid traverses back to the heat source through capillary action where the heat transfer cycle repeats.

Figure 6A:
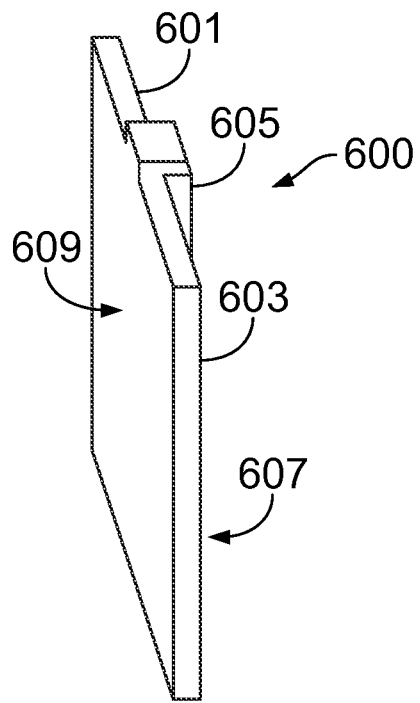
FIG. 6A illustrates a perspective view of the heat frame sidewall according to various implementations of the present disclosure.
Figure 6B:
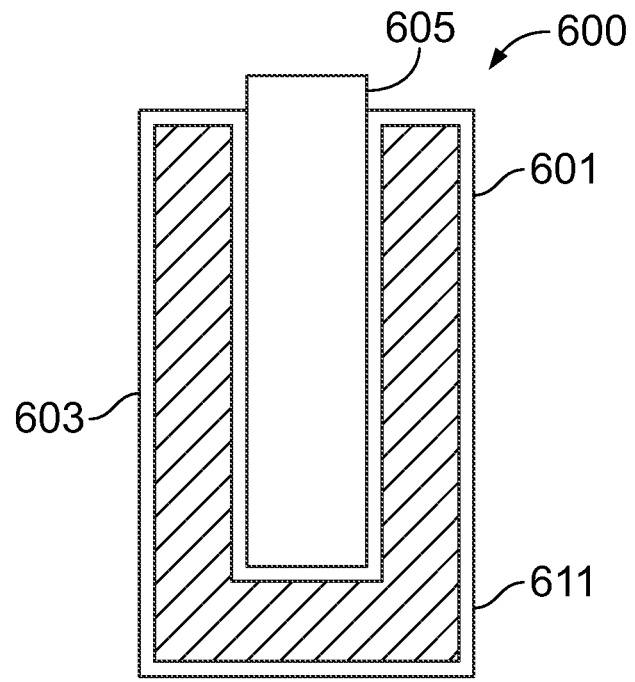
FIG. 6B illustrates a side view of the heat frame sidewall according to various implementations of the present disclosure.

Heat transfers from the processing module 119 can occur via multiple mechanisms. In some implementations, heat is transferred from a high power source, such as a CPU, a GPU, an FPGA, etc., on the processing module 119 to the plurality of heat pipes 107a, 107b, 107n and is then dissipated in the plurality fins 103a, 103b, 103n, thereby cooling the processing module 119. In some implementations, heat is transferred from the high power source, such as a CPU, a GPU, an FPGA, etc., on the processing module 119 to the heat frame 101 and is then dissipated through conduction cooling (hatched region FIG. 6B) against the cooling chassis 111. As described in greater detail below, the heat can be dissipated from the heat frame 101 through conduction cooling via one or more of the first portion 601, the second portion 603, and the base 611 of the heat frame sidewall 600, which are illustrated in FIGS. 6A and 6B and described in greater detail below.

The cooling chassis 111 includes a first wall 113, a second wall 115, and a slot 117 that comprises an open channel between the first wall 113 and the second wall 115. In some implementations, the cooling chassis 111 is referred to as a cooling wall or a cooling chassis wall. In these implementations, the first wall 113 and the second wall 115 are referred to as extensions of a single cooling wall. The slot 117 provides alignment for the processing module 119, provides a metal/metal thermal interface against the cooling chassis 111, provides stability and support for the processing module 119, and enables the heat frame 101 and thermal dissipation solution to extend directly into a cooled or chilled forced air channel, such as the channel 411, into which the heat frame 101 is inserted when the processing module 119 is provided within a conduction cooling chassis.

The processing device 100 further includes a junction 121 between the processing module 119 and the heat frame 101 is provided at or around the slot 117. In some implementations, the junction 121 is a point of connection between the processing module 119 and the heat frame 101. In other implementations, the processing module 119 and the heat frame 101 are a continuous piece that is molded or cast as a single element. In these implementations, the junction 121 is the point at which, for purposes of illustration and discussion, the heat frame 101 ends and the processing module 119 begins.

The cooling chassis 111 includes a first side 111a and a second side 111b. The first side 111a is adjacent to the processing module 119 and the second side 111b is adjacent to the heat frame 101 and is directly exposed to the forced air channel. In other words, the cooling chassis 111 provides separation between the processing module 119 and the heat frame 101 such that the processing module 119 is provided on a first side 111a and the heat frame 101 is provided on a second side 111b, different than the first side 111a. The cooling chassis 111 is described in greater detail below in the description of FIGS. 2 and 3.

The processing module 119 can be any type of processing module that utilizes cooling as described herein. In some implementations, the processing module 119 is a VPX module. In some implementations, the processing module 119 can include a central processing unit (CPU), a graphics processing unit (GPU), and/or any other high-powered processing unit or card. The processing module 119 can be used for any type of computer processing known to one of skill in the art, for example military applications, aerospace applications, security applications, various commercial applications, various communications applications, and so forth. In some implementations, the processing module 119 is a processing card coupled to two heat frames 101, on opposite sides of the processing modules, to form the processing device 800 illustrated in FIGS. 8A and 8B and described in greater detail below.

FIG. 2 illustrates a perspective view of a cooling chassis according to various implementations of the present disclosure. The example of the cooling chassis 111 is presented for illustration only and should not be construed as limiting. Other implementations may be used without departing from the scope of the present disclosure. For example, the present disclosure contemplates one or more cooling chassis 111 having different shapes, sizes, configurations, and so forth.

The cooling chassis 111 includes a base 201 and one or more extensions 203a, 203b, 203c, 203n extending from the base 201. In some implementations, the first wall 113 and the second wall 115 are each extensions 203 as shown in FIG. 2. For example, the first wall 113 of the cooling chassis 111 can be the extension 203a and the second wall 115 of the cooling chassis 111 can be the extension 203b.

The cooling chassis 111 further includes one or more slots 205a, 205b, 205n provided between each of the extensions 203a, 203b, 203c, 203n. For example, the slot 205a is provided between the extensions 203a and 203b, the slot 205b is provided between the extensions 203b and 203c, and so forth. It should be understood that each of the slots 205a, 205b, 205c, 205n can be the slot 117.

In some implementations, one or more of the extensions 203a, 203b, 203c, 203n include a horizontal extension 207. The horizontal extension 207 includes a hole 209 configured to receive an attachment unit, such as a screw, a nail, a staple, or any other suitable attachment unit. The horizontal extension 207 and the hole 209 enable the connection of a cover to the cooling chassis 111. In these implementations, the cover is supported at least by the horizontal extension 207 and fastened to the cooling chassis 111 via the attachment unit inserted through the hole 209.

FIG. 3 illustrates a magnified, perspective view of a cooling chassis according to various implementations of the present disclosure. The example of the cooling chassis 111 is presented for illustration only and should not be construed as limiting. Other implementations may be used without departing from the scope of the present disclosure. For example, the present disclosure contemplates one or more cooling chassis 111 having different shapes, sizes, configurations, and so forth.

The magnified view of the cooling chassis 111 illustrated in FIG. 3 shows a section of the cooling chassis 111 that includes the base 201, two extensions 203a, 203b, and the slot 205a provided between the two extensions 203a, 203b. FIG. 3 further illustrates a groove 301 provided within the base 201, the two extensions 203a, 203b, and the slot 205a. The groove 301 is provided in a U-shape similar to the U-shape created by the base 201, the two extensions 203a, 203b, and the slot 205a. In some implementations, the shape and size of the groove 301 corresponds to a size and shape of an exterior of the processing module 119 and/or the heat frame 101 that is configured to be supported by the cooling chassis 111. In other words, the groove 301 enables the cooling chassis to provide enhanced stability and support for the processing module 119 and the heat frame 101 through a modular, customized fit into the cooling chassis 111.

Various implementations of the present disclosure recognize and take into account the limitations of the existing solutions utilized to stabilize and support a processing module within a conduction cooling chassis. One example solution is the wedge lock, which provides only a small surface contact area on the frame side metal/metal interface and provides uneven heat transfer. For example, by providing a movable conduction cooled wall, i.e., the cooling chassis 111, between two fixed, immovable walls, the present application introduces a thermal design concept that provides stability and support for the processing module 119 within a conduction cooling chassis, provides uniform heat dissipation to a cooling chassis, i.e., the cooling chassis 111, and provides direct heat frame access to a forced air channel, e.g., the forced air channel 411, to incorporate advanced cooling techniques.

FIG. 4A illustrates an exploded view of a cooling chassis assembly according to various implementations of the present disclosure. FIG. 4B illustrates a rear perspective view of a cooling chassis assembly according to various implementations of the present disclosure. The example of the cooling chassis assembly 400 is presented for illustration only and should not be construed as limiting. Other implementations may be used without departing from the scope of the present disclosure. For example, the present disclosure contemplates one or more cooling chassis assemblies 400 having different shapes, sizes, configurations, and so forth.

The cooling chassis assembly 400 includes the cooling chassis 111, a fixed chassis exterior wall 401, and an internal fixed chassis frame 403. The fixed chassis exterior wall 401 is a solid structure that provides an exterior wall for a mil-aero conduction cooling chassis. The term fixed should be understood to mean immovable relative to the cooling chassis 111 and the internal fixed chassis frame 403. In some implementations, the fixed chassis exterior wall 401 is connected to additional exterior walls of the mil-aero conduction cooling chassis, such as the first wall 701 and the third wall 705, as described in greater detail below in the description of FIGS. 7A and 7B.

The internal fixed chassis frame 403 includes a base 405 and two extensions 407a, 407b. In some implementations, the base 405 corresponds to the base 201 of the cooling chassis 111. For example, the length and height of the base 405 corresponds to the length and height of the base 201. In some implementations, the two extensions 407a, 407b correspond to the external-most extensions 203a, 203n of the cooling chassis 111. In other words, the total length of the internal fixed chassis frame 403 is approximately the same as the total length of the cooling chassis 111. In some implementations, the total length of the fixed chassis exterior wall 401 is equal to the total length of the internal fixed chassis frame 403 and/or the cooling chassis 111. In some implementations, the total length of the fixed chassis exterior wall 401 is less than the total length of the internal fixed chassis frame 403 and/or the cooling chassis 111.

The internal fixed chassis frame 403 further includes a gasket 409 that creates a seal between the internal fixed chassis frame 403 and the cooling chassis 111 when the internal fixed chassis frame 403 and the cooling chassis 111 are brought into contact. For example, as illustrated in FIG. 4B, the cooling chassis 111 can be fastened against the internal fixed chassis frame 403 via one or more fasteners 419. The seal created by the gasket 409 restricts air, dust particles, dirt particles, and so forth from passing through. In various implementations, the gasket 409 is comprised of one or more of a rubber material, a neoprene material, a silicone material, a polyurethane material, or any other suitable material to create a seal between the internal fixed chassis frame 403 and the cooling chassis 111.

FIG. 4C illustrates a front perspective view of the cooling chassis according to various implementations of the present disclosure. The cooling chassis 111 includes a front face 413 and a rear face 415. The rear face 415 interfaces with the gasket 409 of the internal fixed chassis frame 403. The front face 413 faces the fixed chassis exterior wall 401. In some implementations, the cooling chassis 111 includes a plurality of holes 417. Each of the plurality of holes 417 is configured to receive a fastener 419 that fastens the cooling chassis 111 to one or both of the fixed chassis exterior wall 401 and the internal fixed chassis frame 403. For example, one or both of the fixed chassis exterior wall 401 and the internal fixed chassis frame 403 can include respective holes corresponding to the plurality of holes 417 to also receive the fastener. The fastener 419 can be any type of fastener suitable for fastening the cooling chassis 111 to one or both of the fixed chassis exterior wall 401 and the internal fixed chassis frame 403. For example, the fastener 419 can be a screw.

As discussed herein, the cooling chassis 111 and the internal fixed chassis frame 403 are brought into contact. The cooling chassis 111 and the internal fixed chassis frame 403 are brought into contact by the movement of the cooling chassis 111 toward the internal fixed chassis frame 403. In some implementations, the cooling chassis 111 is moved toward and brought into contact with the internal fixed chassis frame 403 by one or more of spring loaded screws, worm screws, toggle clamps, rail clamps, snap latches, wedge locks, and so forth. In some implementations, a plurality of the fasteners 419 are used to bring the cooling chassis 111 into contact with the internal fixed chassis frame 403.

For example, the fastener 419 can be a spring loaded screw that passes through one of the plurality of holes 417. As the torque on the fastener 419 is increased, the cooling chassis 111 is brought into contact with the internal fixed chassis frame 403. The torque on the fastener 419 is brought to a specified value. In some implementations, the specified value is determined so as to stay within mechanical tolerance requirements for the fastener 419, the cooling chassis 111, the internal fixed chassis frame 403, and/or the fixed chassis exterior wall 401. This enables the total motion of the cooling chassis 111 to be limited, by design, while also allowing only minimal relaxation to allow for installation and removal of a processing module 119. As shown in FIG. 4C, the cooling chassis 111 includes a plurality of holes, each of which is configured to receive an individual fastener 419. In so doing, multiple fasteners 419 can be torqued at approximately the same time to maintain even clamping pressure lengthwise along the cooling chassis 111.

In some implementations, as discussed in greater detail below, a conduction cooling chassis, such as the mil-aero conduction cooling chassis 700, includes two analogous cooling chassis 111 on opposite sides of the conduction cooling chassis. In these implementations, each cooling chassis 111 is brought into contact with the respective internal fixed chassis frame 403 simultaneously, or substantially simultaneously, in order to maintain even, parallel clamp pressure lengthwise along each cooling chassis 111.

In another implementation, the cooling chassis 111 is brought into contact with the internal fixed chassis frame 403 via a rail clamp assembly. FIG. 5A illustrates a perspective view of the rail clamp assembly according to various implementations of the present disclosure. FIG. 5B illustrates a magnified, perspective view of the rail clamp according to various implementations of the present disclosure. The example of the rail clamp assembly 500 is presented for illustration only and should not be construed as limiting. Other implementations may be used without departing from the scope of the present disclosure. For example, the present disclosure contemplates one or more rail clamp assemblies 500 having different shapes, sizes, configurations, and so forth.

The rail clamp assembly 500 includes a first clamp 501, a second clamp 503, and a connector 520. As shown in FIG. 5B, the first clamp 501 includes a first extending portion 511, a second extending portion 513, and a groove 515 provided between the first extending portion 511 and the second extending portion 513. The groove 515 illustrated in FIG. 5B is trapezoid shaped, but this example should not be construed as limiting. The groove 515 can be provided in a square shape, a rectangular shape, a circular shape, a triangular shape, or any other suitable shape.

In some implementations, the first extending portion 511 extends further than the second extending portion 513 while the second extending portion 513 has a wider face than the first extending portion 511. It should be understood that the second clamp 503 has an identical configuration as the first clamp 501, but is rotated one hundred eighty degrees in order to provide the same structure and stability on the opposite side of the conduction cooling chassis.

In some implementations, the rail clamp assembly 500 is integrated with additional fasteners, such as the fastener 419, to compress the cooling chassis 111 against the modular heat frame, i.e., the internal fixed chassis frame 403, via the connector 520. The connector 520 includes a first extending portion 521a, a second extending portion 521b, a first groove 523a, a second groove 523b, and a bridge 525. The bridge 525 is an extension provided between the first extending portion 521a and the second extending portion 521b and, when mounted on the cooling chassis 111, is provided perpendicular to both cooling chassis 111 in the conduction cooling chassis. The first extending portion 521a extends into the groove 515 of the first clamp 501, the second extending portion 521b extends into the groove of the second clamp 503, the first extending portion 511 of the first clamp 501 extends into the first groove 523a, and the first extending portion 511 of the second clamp 503 extends into the second groove 523b.

As described in greater detail below in the description of FIGS. 7A and 7B, the conduction cooling chassis includes a first cooling chassis 111 and a second cooling chassis 111. In some implementations, the first cooling chassis 111 and second cooling chassis 111 are referred to as a left cooling chassis and a right cooling chassis. The bridge 525 extends across and perpendicular to each of the left cooling chassis and the right cooling chassis. The first clamp 501 is provided external to the right cooling chassis and the second clamp 503 is provided external to the left cooling chassis. In some implementations, the first clamp 501 and the second clamp 503 are provided internal of a right fixed chassis exterior wall 401 and internal of a left fixed chassis exterior wall 401, respectively. In other implementations, the first clamp 501 and the second clamp 503 are provided external of a right fixed chassis exterior wall 401 and external of a left fixed chassis exterior wall 401, respectively. When the fastener(s) 419 are tightened, the connector 520 provides a stabilizing force as the respective left and right cooling chassis 111 are compressed toward the respective internal fixed chassis frame 403. As described above, the fastener 419 can be a spring loaded screw that, when tightened to the specified torque value, compresses the cooling chassis 111 against the internal fixed chassis frame 403. The compression forms a tight thermal bond while still allowing a processing module 119 to be removed when the rail clamp assembly 500, or another clamping mechanism used in another implementation, is loosened.

Figure 7A:
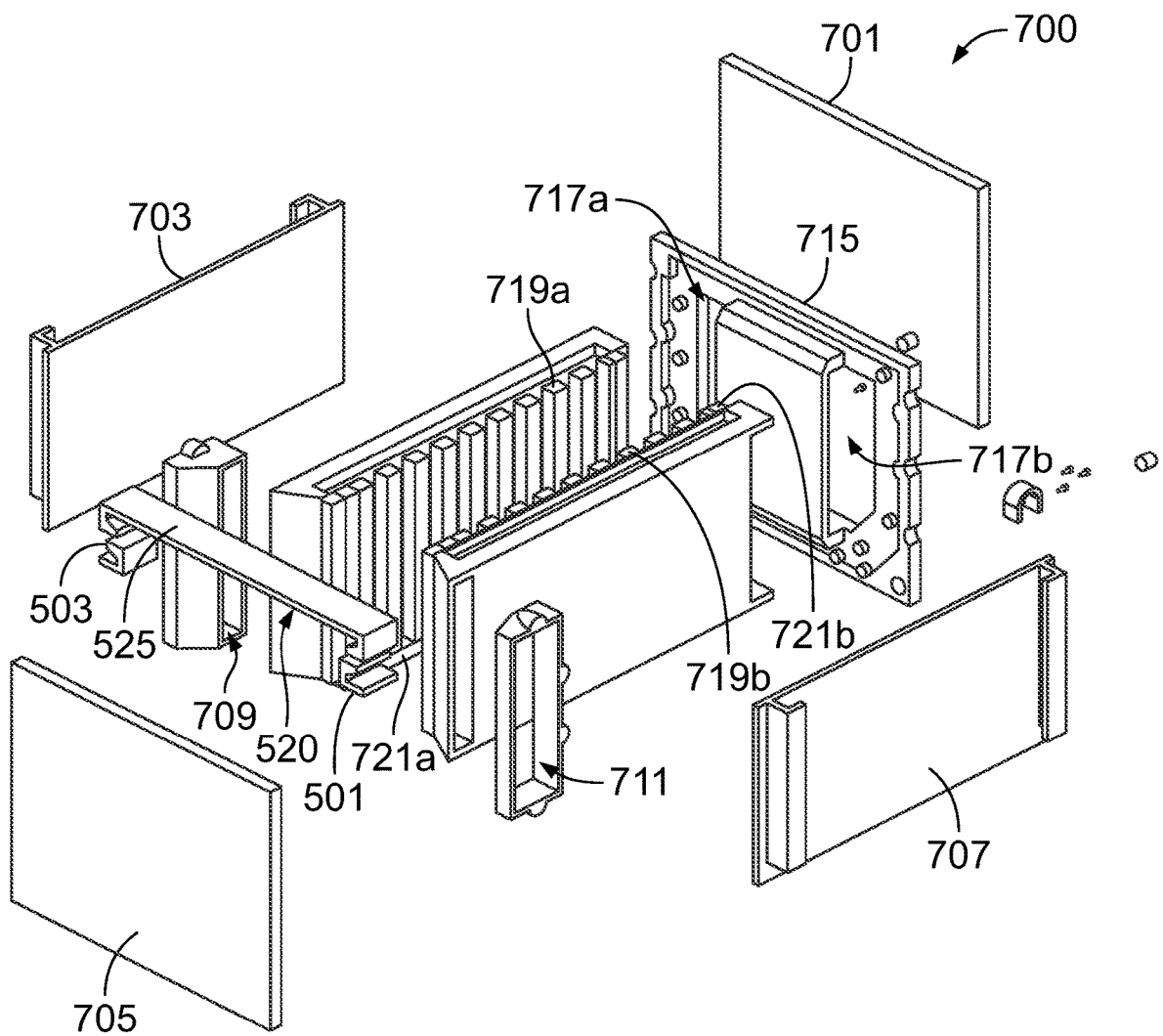
FIG. 7A illustrates an exploded view of an assembly including the processing device according to various implementations of the present disclosure.
Figure 7B:
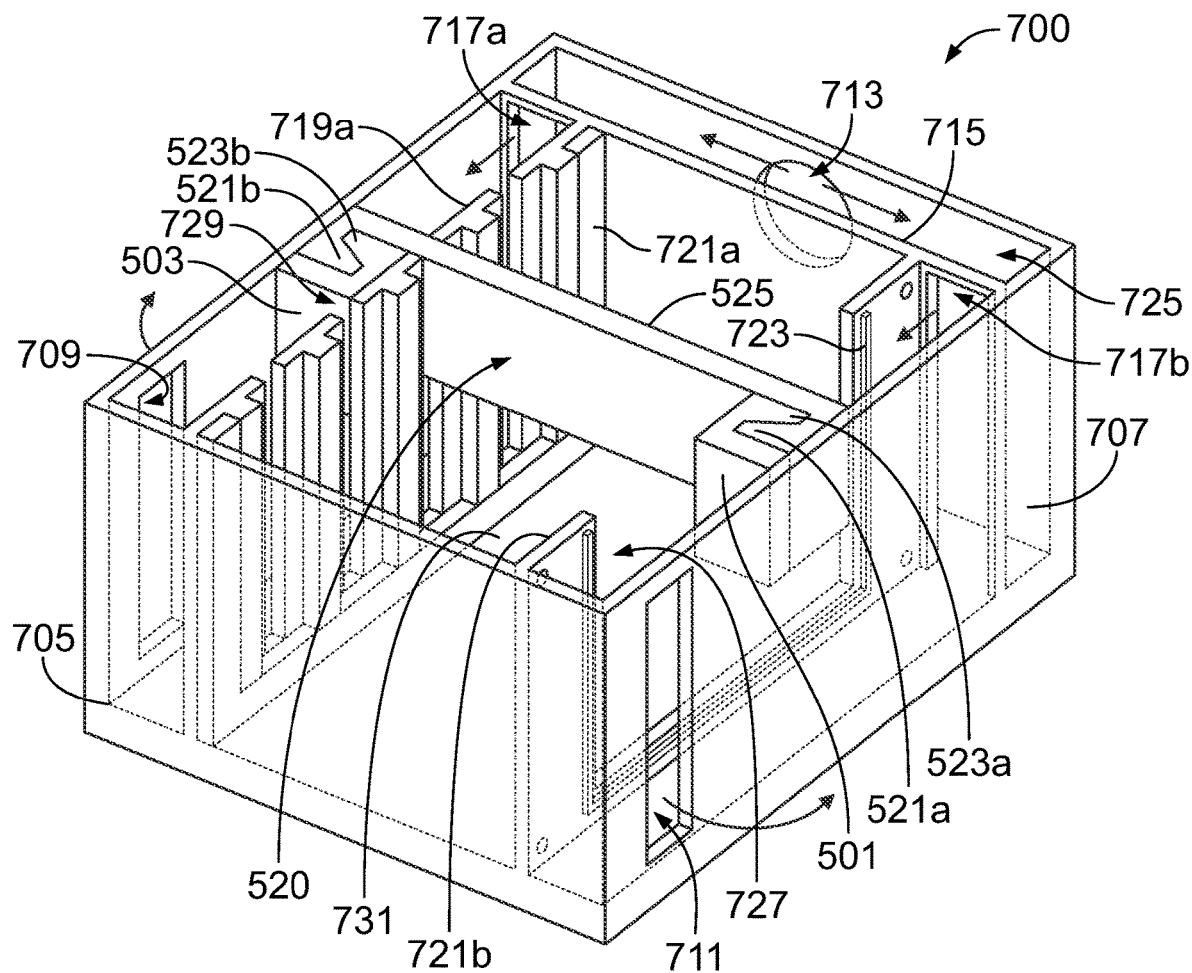
FIG. 7B illustrates a perspective view of an assembly including the processing device according to various implementations of the present disclosure.

In some implementations, the rail clamp assembly 500 is integrated into a cover that traverses an entire side of a conduction cooling chassis, such as the mil-aero conduction cooling chassis 700 illustrated in FIGS. 7A and 7B. For example, the first clamp 501 and the second clamp 503 can be extended to be equal or approximately equal to a length of the cooling chassis 111 and/or the fixed chassis exterior wall 401 and the connector 520 is extended to be a length equal to or approximately equal to the lengths of the first clamp 501 and the second clamp 503.

In other implementations, the conduction cooling chassis includes a plurality of rail clamp assemblies 500. In other words, the conduction cooling chassis can include a first rail clamp assembly 500 at a first end of the cooling chassis 111, a second rail clamp assembly 500 at a second end of the cooling chassis 111, and a third rail clamp assembly 500 between the first and second rail clamp assemblies. Although described herein as including three rail clamp assemblies, various implementations are possible. It should be understood that any number of rail clamp assemblies, including more or less than three, can be used to provide a clamping force in the conduction cooling chassis.

In some implementations, the rail clamp assembly 500 is included in part of a separate cover for a mil-aero conduction cooling chassis 700, described in greater detail below. For example, the connector 520 can be a panel in a cover that is placed on the mil-aero conduction cooling chassis 700.

FIG. 6A illustrates a perspective view of the heat frame sidewall according to various implementations of the present disclosure. FIG. 6B illustrates a side view of the heat frame sidewall according to various implementations of the present disclosure. The example of the heat frame sidewall 600 is presented for illustration only and should not be construed as limiting. It should be understood that in the perspectives of the heat frame sidewall 600 illustrated in FIGS. 6A and 6B, the cooling fins and heat pipes are not shown for ease of illustration. Other implementations may be used without departing from the scope of the present disclosure. For example, the present disclosure contemplates one or more heat frame sidewalls 600 having different shapes, sizes, configurations, and so forth.

The heat frame sidewall 600 includes a first portion 601, a second portion 603, an extension 605 between the first portion 601 and the second portion 603, and a base 611. In some implementations, as shown in FIG. 6B, the extension 605 does not extend along the entire heat frame sidewall 600. In other implementations, the extension 605 extends along the entire heat frame sidewall 600.

In some implementations, the heat frame sidewall 600 is any one of the extensions 203a-203n of the cooling chassis 111. For example, the front face 413 of the cooling chassis 111 is the first face 607 and the rear face 415 of the cooling chassis is the second face 609. As illustrated in FIGS. 4A and 4B, the gasket 409 creates a seal along the base 611 when the cooling chassis 111 is pressed into contact with the internal fixed chassis frame 403, as shown in greater detail in FIG. 7B.

The present disclosure recognizes and takes into account the challenges faced by metal to metal interfaces. At a microscopic level, metal to metal interfaces are full of surface irregularities, which form air pockets that reduce the thermal transfer effectiveness of the interface. To address this, a thermal interface material, such as a thermal grease, can be applied to fill the air pockets and enhance thermal conduction from one solid surface to another. However, in some environments, grease or other semi-solid thermal interfaces are not viable solutions for surfaces that may require periodic maintenance.

In some implementations, the first portion 601 and the second portion 603 include a thermal interface material to enhance thermal performance of the heat frame sidewall 600. In other implementations, the first portion 601 and the second portion 603 are bonded to a thermal interface material, rather than the thermal interface material being included. The thermal interface material can be a soft metal alloy that enables a tight thermal bond when part of an interface, while still allowing the first portion 601 and the second portion 603 to be removed from the interface for maintenance.

FIG. 7A illustrates an exploded view of a mil-aero conduction cooling chassis according to various implementations of the present disclosure. FIG. 7B illustrates a perspective view of the mil-aero conduction cooling chassis according to various implementations of the present disclosure. The example of the mil-aero conduction cooling chassis 700 is presented for illustration only and should not be construed as limiting. Other implementations may be used without departing from the scope of the present disclosure. For example, the present disclosure contemplates one or more mil-aero conduction cooling chassis 700 having different shapes, sizes, configurations, and so forth.

The mil-aero conduction cooling chassis 700 comprises four exterior walls including a first wall 701, a second wall 703, a third wall 705, and a fourth wall 717. As shown in the perspective of FIG. 7B, the first wall 701 can be referred to as a back wall, the second wall 703 can be referred to as a left side wall, the third wall 705 can be referred to as a front wall, and the fourth wall 707 can be referred to as a right side wall. However, the terms front, back, left, right, and side are merely for illustration and ease of description only. Based on the perspective from which the mil-aero conduction cooling chassis 700 is viewed, the front wall can appear to be the back wall, the left side can appear to be the right side, and so forth.

In some implementations, each of the first wall 701, second wall 703, third wall 705, and fourth wall 707 are separate walls that are coupled together by one or more fastening means. For example, the first wall 701 can be coupled to the second wall 703 and the fourth wall 707 via an adhesive, one or more screws, one or more clamps, or any other suitable coupling means to maintain a connection between the various exterior walls. In the same or similar manner, the second wall 703 is coupled to the first wall 701 and the third wall 705, the third wall 705 is coupled to the second wall 703 and the fourth wall 707, and the fourth wall 707 is coupled to the third wall 705 and the first wall 701. In other implementations, the first wall 701, second wall 703, third wall 705, and fourth wall 707 are a single component that is cast, molded, welded, or otherwise produced as a single component.

In some implementations, the first wall 701, second wall 703, third wall 705, and fourth wall 707 form a square frame. In In some implementations, the first wall 701, second wall 703, third wall 705, and fourth wall 707 form a rectangular frame. In some implementations, the second wall 703 and the fourth wall 707 are each implementations of the fixed chassis exterior wall 401.

The second wall 703 includes a first air duct 709. The fourth wall 707 includes a second air duct 711. The first air duct 709 and the second air duct 711 are configured to enable air flow to enter or exit the mil-aero conduction cooling chassis 700. The third air duct 713 is configured to either pull or push forced air into the cooling chassis 700. In implementations where one or more processing modules are inserted into the mil-aero conduction cooling chassis 700, the air flowing through space 729 and space 727 absorbs heat from the heat frame, fins, and chassis cooling wall; thereby cooling the processing modules. In some implementations, the first wall 701 includes a third air duct 713. The third air duct 713 is configured to provide additional air flow into or out of the mil-aero conduction cooling chassis 700.

The mil-aero conduction cooling chassis 700 further includes a rear plenum 715. It should be understood that the term rear is for illustration and description only. In implementations where the mil-aero conduction cooling chassis 700 is viewed from a perspective different than the perspective illustrated in FIGS. 7A and 7B, the rear plenum 715 can be seen on a side or front of the mil-aero conduction cooling chassis 700. The rear plenum 715 is an internal frame of the mil-aero conduction cooling chassis 700 and provides additional structure and stability to the mil-aero conduction cooling chassis 700. A space 725 is provided between the first wall 701 and the rear plenum 715 that facilitates air flow into or out of the mil-aero conduction cooling chassis 700. The rear plenum 715 includes a first plenum duct 717a that enables air flow into or out of and a space 729 and a second plenum duct 717b that enables air flow into or out of a space 727.

The mil-aero conduction cooling chassis 700 further includes a first cooling chassis 719a and a second cooling chassis 719b. Each of the first cooling chassis 719a and the second cooling chassis 719b can be the cooling chassis 111. The first cooling chassis 719a is provided proximate to the second wall 703 and separated from the second wall 703 by the space 729. The second cooling chassis 719b is provided proximate to the fourth wall 707 and separated from the fourth wall 707 by the space 727. In some implementations, each of the space 727 and the space 729 are the channel 411 described in greater detail above.

The mil-aero conduction cooling chassis 700 further includes a first internal fixed chassis frame 721a and a second internal fixed chassis frame 721b. Each of the first internal fixed chassis frame 721a and the second internal fixed chassis frame 721b can be the internal fixed chassis frame 403. The first internal fixed chassis frame 721a is provided proximate to the first cooling chassis 719a and the second internal fixed chassis frame 721b is provided proximate the second cooling chassis 719b (not pictured in FIG. 7B). In some implementations, the first internal fixed chassis frame 721a is clamped to the first cooling chassis 719a and the second internal fixed chassis frame 721b is clamped to the second cooling chassis 719b via a rail clamp assembly, for example the rail clamp assembly 500 illustrated in FIGS. 5A and 5B and described above.

Each of the first internal fixed chassis frame 721a and the second internal fixed chassis frame 721b include a gasket 723. The gasket 723 can be the gasket 409. The gasket 723 enables the first internal fixed chassis frame 721a to create a seal when clamped to the first cooling chassis 719a and enables the second internal fixed chassis frame 721b to create a seal when clamped to the second cooling chassis 719b.

In some implementations, the mil-aero conduction cooling chassis 700 includes a mounting space 731 configured to receive one or more processing device, such as the processing device 100. For example, the processing device 100 can be mounted within the mounting space 731 such that the processing device 100 is provided within the mounting space 731, one heat frame 101 is provided in the space 729, and another heat frame is provided in the space 727. In some implementations, the mounting space 731, the space 727, and the space 729 are of a suitable size to accommodate a plurality of processing devices 100 of varying sizes and/or shapes.

In implementations where one or more processing modules is mounted within the mounting space 731 of the mil-aero conduction cooling chassis 700, the first air duct 709, second air duct 711, and the third air duct 713 provide multiple configurations to enable air flow to cool the mounted one or more processing modules. In one implementation, air can enter the mil-aero conduction cooling chassis 700 via the third air duct 713 to the space 725 between the first wall 701 and the rear plenum 715. From the space 727, the air can flow into one or both of i) the space 727 between the cooling chassis 719b and the fourth wall 707 via the second plenum duct 717b, and ii) the space 729 between the cooling chassis 719a and the second wall 703 via the first plenum duct 717a. From the space 727, the air flows out of the mil-aero conduction cooling chassis 700 via the second air duct 711. From the space 729, the air flows out of the mil-aero conduction cooling chassis 700 via the first air duct 709. In another implementation, air can enter the mil-aero conduction cooling chassis 700 via one or both of the first air duct 709 and the second air duct 711 to the space 729 and the space 727, respectively. The air can flow through the space 729, passing over a plurality of fins coupled to the processing module to cool the mounted processing module, and through the first plenum duct 717a to the space 725. Likewise, the air can flow through the space 727, passing over a plurality of fins coupled to the processing module to cool the mounted processing module, and through the second plenum duct 717b to the space 725.

Figure 8A:
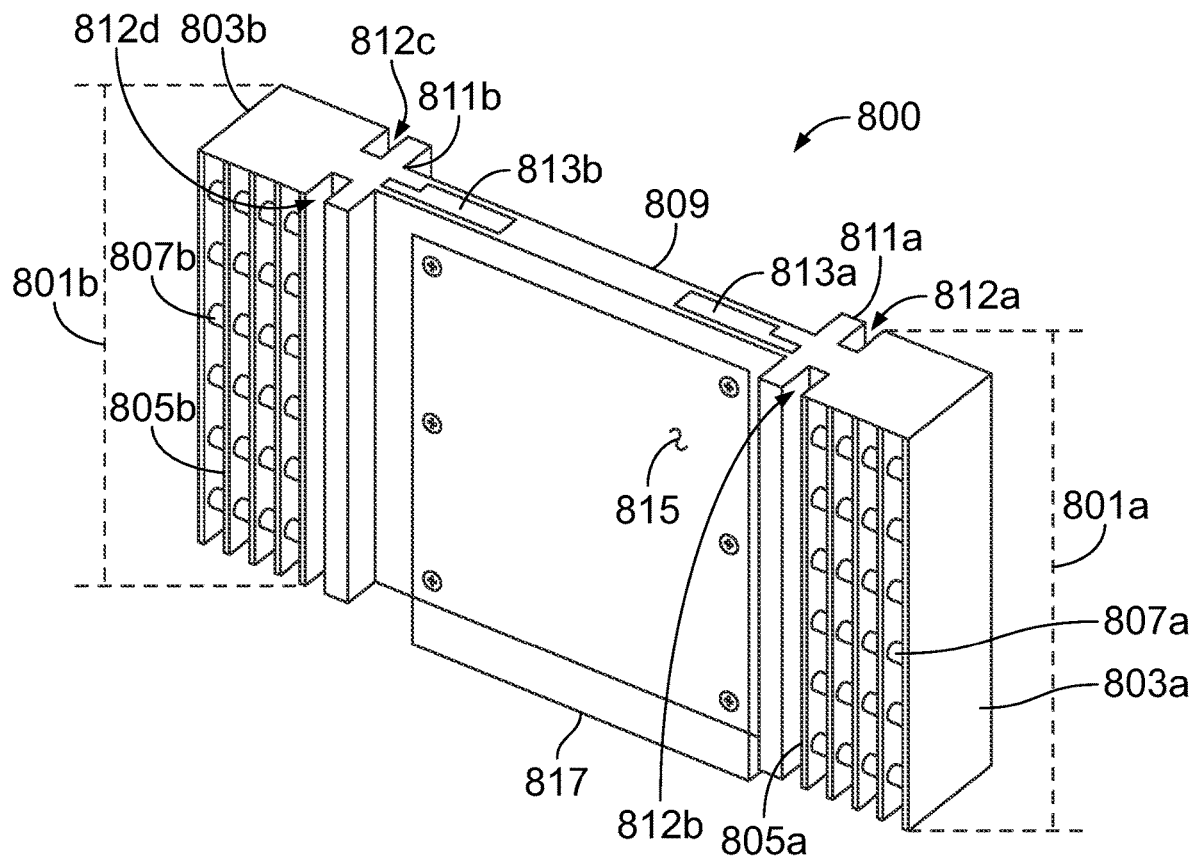
FIG. 8A illustrates a perspective view of a processing device according to various implementations of the present disclosure.
Figure 8B:
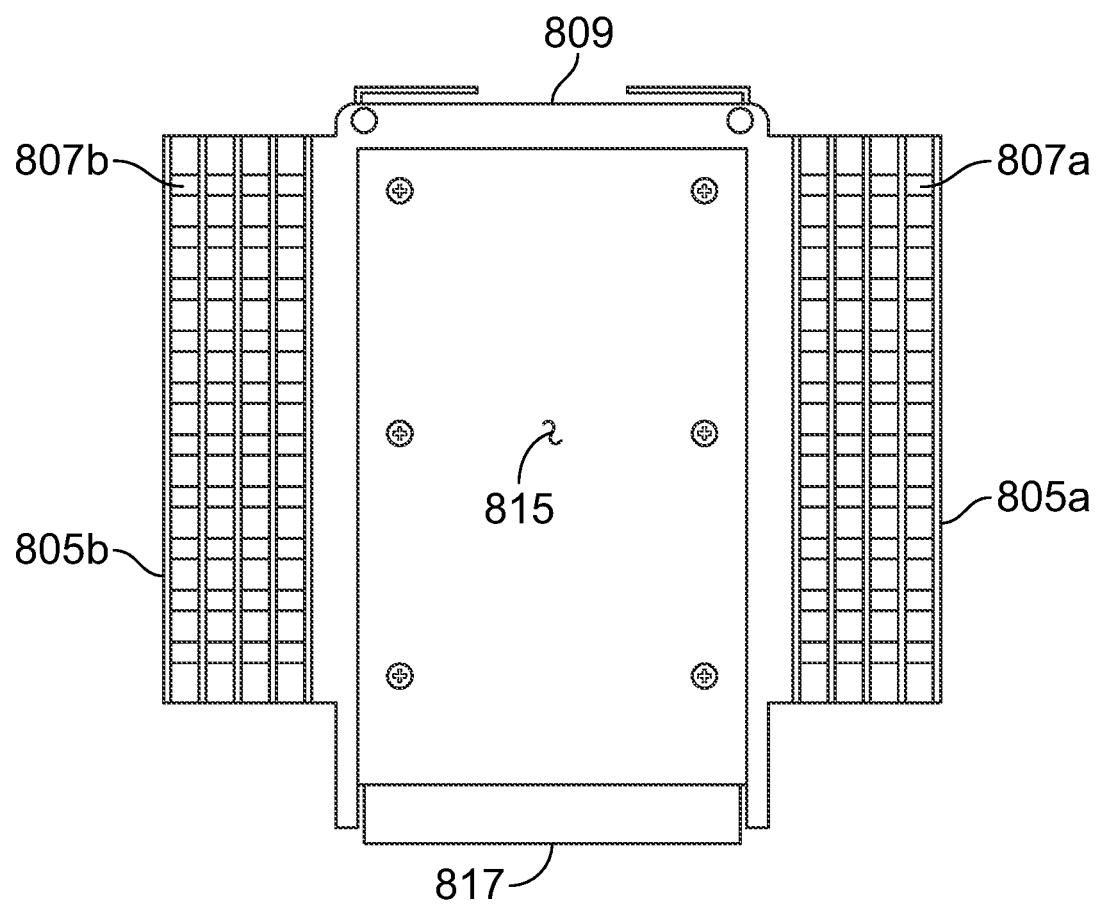
FIG. 8B illustrates a front view of a processing device according to various implementations of the present disclosure.

FIG. 8A illustrates a perspective view of a processing device according to various implementations of the present disclosure. FIG. 8B illustrates a front view of a processing device according to various implementations of the present disclosure. The example of the processing device 800 is presented for illustration only and should not be construed as limiting. Other implementations may be used without departing from the scope of the present disclosure. For example, the present disclosure contemplates one or more processing devices 800 having different shapes, sizes, configurations, and so forth.

The processing device 800 includes a first heat frame 801a, a second heat frame 801b, a heat frame connecting portion 809, and a processing module 815. The first and second heat frame 801a, 801b can be the heat frame 101 as described in greater detail above. For example, the first heat frame 801a includes a frame 803a, a plurality of fins 805a corresponding to the plurality of fins 103a-103n, and a plurality of heat pipes 807a corresponding to the plurality of heat pipes 107a-107n. Likewise, the second heat frame 801b includes a frame 803b, a plurality of fins 805b corresponding to the plurality of fins 103a-103n, and a plurality of heat pipes 807b corresponding to the plurality of heat pipes 107a-107n. The first heat frame 801a is coupled to a first side of the processing module 815 and the second heat frame 801b is coupled to a second side of the processing module 815, opposite the first side.

Figure 9:
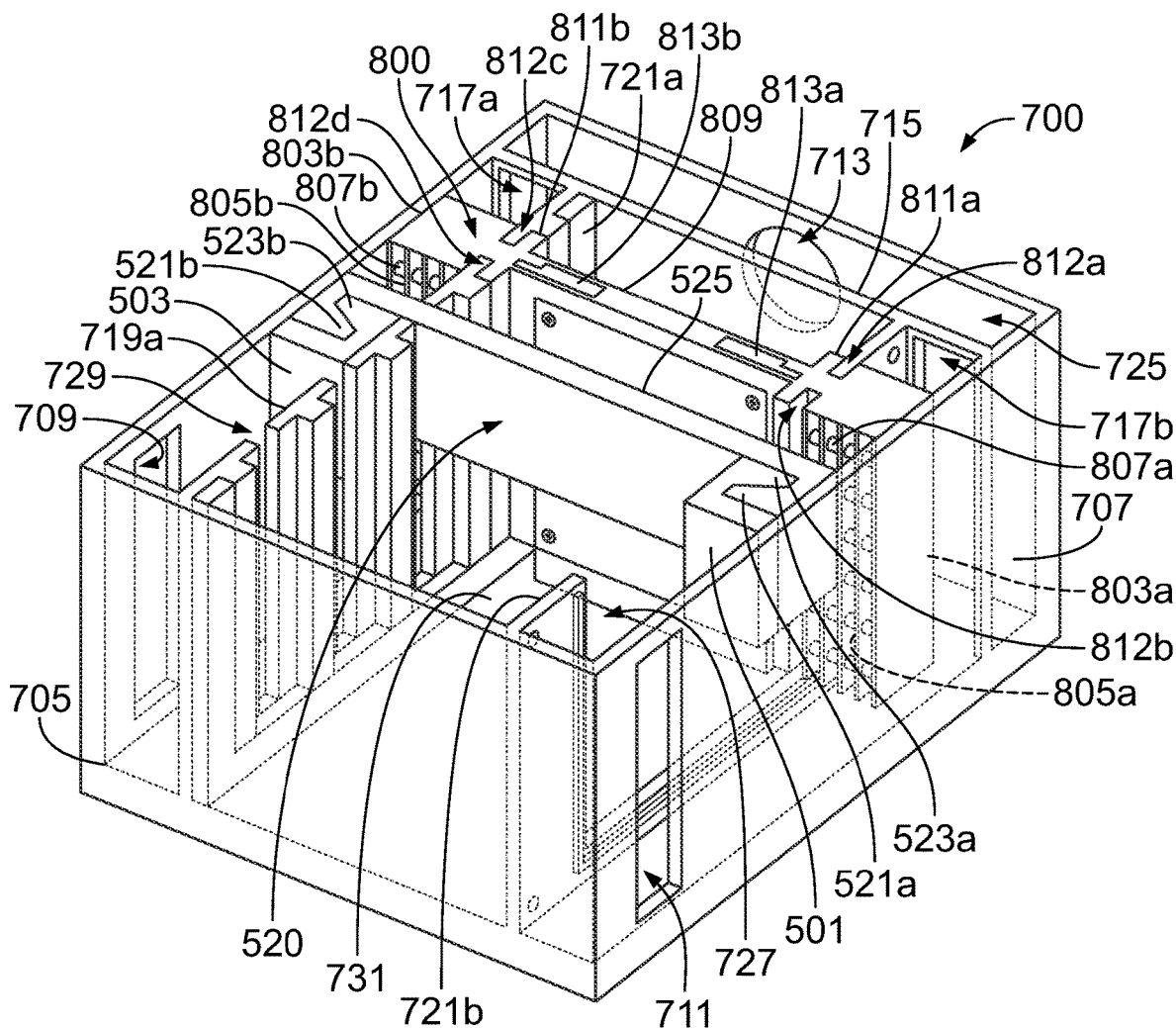
FIG. 9 illustrates a conduction cooling chassis according to various implementations of the present disclosure.

The heat frame connecting portion 809 is provided between the first heat frame 801a and the second heat frame 801b and is an extension of the frame 803a and the frame 803b. The heat frame connecting portion 809 is provided on a third side of the processing module 815. In some implementations, due to the connection between the frame 803a and the frame 803b via the heat frame connection portion 809, the first heat frame 801a, second heat frame 801b, and the heat frame connecting portion 809 are referred to collectively as a heat frame module. The heat frame connecting portion 809 further includes an extending portion 811a that creates a first pair of slots 812a, 812b and an extending portion 811b that creates a second pair of slots 812c, 812d. The first pair of slots 812a, 812b and the second pair of slots 812c, 812d provide a space for respective extensions of the cooling chassis 111 to extend in implementations where the processing device 800 is installed in a mil-aero conduction cooling chassis, as illustrated in FIG. 9 and described in greater detail below. In some implementations, where the first heat frame 801a of the processing device 800 is installed on the cooling chassis 111, the first heat frame 801a can be installed in any of the one or more slots 205a, 205b, 205n provided between each of the extensions 203a, 203b, 203c, 203n. For example, the first heat frame 801a can be installed in the slot 205a. The first extension 203a is extended through the slot 812b and the second extension 203b is extended through the slot 812a. A similar configuration enables the second heat frame 801b to be installed on a separate cooling chassis, for example where the second heat frame 801b is installed in the slot 205a, the first extension 203a is extended through the slot 812c and the second extension 203b is extended through the slot 812d.

The processing module 815 can be the processing module 119 illustrated in FIG. 1. As described above in the description of FIG. 1, the processing module 815 can be any type of processing module that utilizes cooling as described herein. In some implementations, the processing module 119 is a VPX card. In some implementations, the processing module 119 includes a central processing unit (CPU), a graphics processing unit (GPU), or any other high-powered processing unit or card. The processing module 119 can be used for any type of computer processing known to one of skill in the art, for example military applications, aerospace applications, security applications, various commercial applications, various communications applications, and so forth.

The processing module 815 is installed between the first heat frame 801*a* and the second heat frame 801*b*. In some implementations, the processing module 815 is referred to as mounted to the heat frame connecting portion 809 between the first heat frame 801*a* and the second heat frame 801*b*. The processing device 800 further includes a connector 817, provided on a fourth side of the processing module 815 opposite the third side, to connect the processing module 815 to the mil-aero conduction cooling chassis 700. In implementations where the processing module 815 is a VPX card, the connector 817 is a VPX connector that connects the VPX card to the mil-aero conduction cooling chassis 700.

In some implementations, the processing device 800 further includes one or more ejector handles, such as the ejector handles 813*a*, 813*b* to release the processing module 815 from the mil-aero conduction cooling chassis 700. For example, the ejector handles 813*a*, 813*b* can be mechanical levers that, when pulled, release the processing module 815 from the mil-aero conduction cooling chassis 700.

FIG. 9 illustrates a mil-aero conduction cooling chassis according to various implementations of the present disclosure. The example of the mil-aero conduction cooling chassis 900 is presented for illustration only and should not be construed as limiting. Other implementations may be used without departing from the scope of the present disclosure. For example, the present disclosure contemplates one or more mil-aero conduction cooling chassis 900 having different shapes, sizes, configurations, and so forth.

FIG. 9 illustrates the mil-aero conduction cooling chassis 900 that includes the processing device 800 mounted into the mil-aero conduction cooling chassis 700 previously illustrated in FIGS. 7A and 7B. The processing module 815 and connector 817 are mounted in the mounting space 731, the first heat frame 801*a* is mounted in the space 729, and the second heat frame 801*b* is mounted in the space 727. For ease of illustration and description, only one processing device 800 is illustrated as mounted in the mil-aero conduction cooling chassis 700. However, various implementations are possible. One or more additional processing devices 800 can be mounted in additional slots in the cooling chassis 719*a*, 719*b* that are between the processing device 800 and the rear plenum 715 and one or more additional processing devices 800 can be mounted in additional slots in the cooling chassis 719*a*, 719*b* that are between the processing device 800 and the third wall 705.

As described herein, the cooling chassis 111 is movable between the internal fixed chassis frame 403 and the fixed chassis exterior wall 401. In other words, the first cooling chassis 719*a* is movable between the second wall 703 and the first internal fixed chassis frame 721*a* and the second cooling chassis 719*b* is movable between the fourth wall 707 and the second internal fixed chassis frame 721*b* in order to provide support and stability to the one or more processing devices 800 mounted in the mil-aero conduction cooling chassis 700. In some implementations, the first cooling chassis 719*a* and the second cooling chassis 719*b* are moved toward the first internal fixed chassis frame 721*a* and the second internal fixed chassis frame 721*b*, respectively, via the tightening of the rail clamp assembly 500. For example, the connector 520 can be provided lengthwise across the mil-aero conduction cooling chassis 900 perpendicular to the first cooling chassis 719*a* and the second cooling chassis 719*b*. The first clamp 501 is provided on the first cooling chassis 719*a* and the second clamp 503 is provided on the second cooling chassis 719*b*. The fasteners 419 can then be tightened on the connector 520 to compress the first cooling chassis 719*a* toward the first internal fixed chassis frame 721*a* and the second cooling chassis 719*b* toward the second internal fixed chassis frame 721*b*. The fasteners 419 are tightened within mechanical torque specifications to provide sufficient support, without over-tightening, for the first cooling chassis 719*a* and the second cooling chassis 719*b*.

In some implementations, each of the first cooling chassis 719*a* and the second cooling chassis 719*b* move less than ten millimeters to provide the support and stability to the one or more processing devices 800. In some implementations, each of the first cooling chassis 719*a* and the second cooling chassis 719*b* move less than five millimeters to provide the support and stability to the one or more processing devices 800. In some implementations, each of the first cooling chassis 719*a* and the second cooling chassis 719*b* move less than two millimeters to provide the support and stability to the one or more processing devices 800.

The implementation of the mil-aero conduction cooling chassis 900 illustrated in FIG. 9 provides a stable, rugged solution for conduction cooling of the one or more processing devices 800. For example, the mil-aero conduction cooling chassis 900 minimizes the unwanted air or dust particles from entering the mil-aero conduction cooling chassis 900 while enabling improved conduction cooling of the one or more processing devices.

Figure 10:
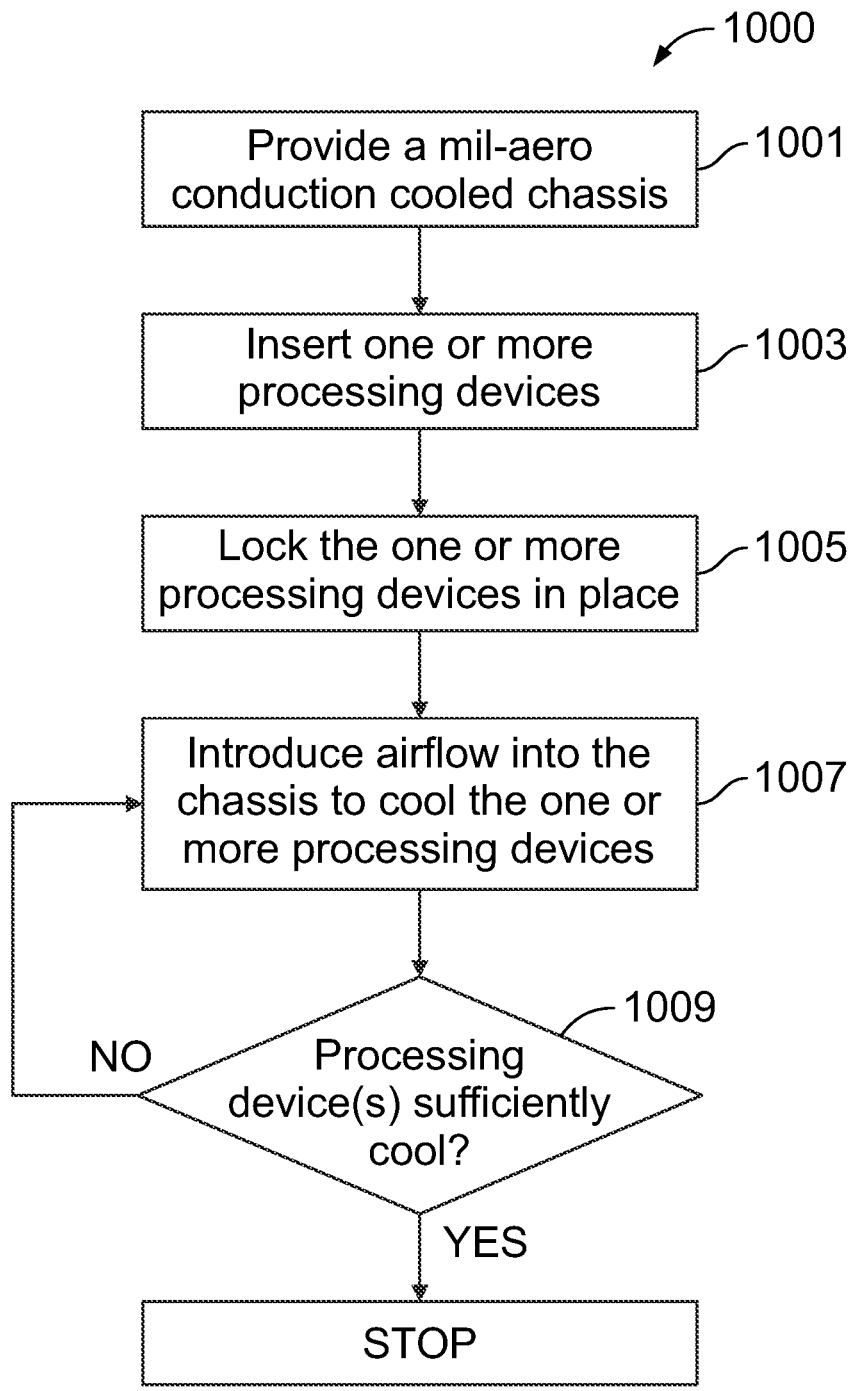
FIG. 10 illustrates a flowchart diagram illustrating a workflow for cooling one or more processing devices according to various implementations of the present disclosure.

FIG. 10 illustrates a flowchart diagram illustrating a workflow for cooling one or more processing devices according to various implementations of the present disclosure. The method 1000 can be executed by one or more component described herein, such as the mil-aero conduction cooling chassis 900.

The method 1000 may be implemented by the mil-aero conduction cooling chassis 900, i.e., the one or more processing devices 800 mounted in the mil-aero conduction cooling chassis 700. In some implementations, the method 1000 also utilizes additional components of the mil-aero conduction cooling chassis described herein, such as the rail clamp assembly 500.

The method 1000 begins by providing a mil-aero conduction cooling chassis, such as the mil-aero conduction cooling chassis 700, in step 1001. In step 1003, one or more processing devices, such as the processing device 800, is mounted, or inserted, into the mil-aero conduction cooling chassis 700. For example, processing module 815 and connector 817 are mounted in the mounting space 731, the first heat frame 801*a* is mounted in the space 729, and the second heat frame 801*b* is mounted in the space 727.

In step 1005, the one or more processing devices 800 are locked into place in the mil-aero conduction cooling chassis 700 via the rail clamp assembly 500. For example, as described herein, the fasteners 419 are tightened on the connector 520 to compress the first cooling chassis 719*a* toward the first internal fixed chassis frame 721*a* and the second cooling chassis 719*b* toward the second internal fixed chassis frame 721*b*. In some implementations, a separate cover is attached to the mil-aero conduction cooling chassis 900 to provide additional support and/or prevent foreign particles from being introduced into the mil-aero conduction cooling chassis 900. In some implementations, the rail clamp assembly 500 is included as part of the cover. In some implementations, a plurality of rail clamp assemblies 500 are utilized to lock the one or more processing devices 800 into place in the mil-aero conduction cooling chassis 700.

In step 1007, airflow is introduced into mil-aero conduction cooling chassis 900 to cool the one or more processing devices 800. For example, air is introduced into mil-aero conduction cooling chassis 900 that flows over the plurality of fins 805*a*, 805*b*. The cooling of the plurality of fins 805*a*, 805*b* in turn cools the particular processing device 800 coupled to the plurality of fins 805*a*, 805*b*.

In step 1009, it is determined whether the one or more processing devices 800 have been sufficiently cooled by the airflow. In some implementations, the determination is made by the one or more processing devices 800. In some implementations, the determination is made by an external device that measures a temperature of the one or more processing devices 800. In implementations where the one or more processing devices 800 are determined to be sufficiently cooled, the method 1000 terminates. In implementations where the one or more processing devices 800 are determined to be sufficiently cool, step 1007 is repeated until, in step 1009, it is determined that the one or more processing devices 800 are sufficiently cooled.

In some implementations, one processing device 800 may be determined to be sufficiently cool while one processing device 800 may be determined to not be sufficiently cool. In these implementations, step 1007 is repeated until all of the processing devices 800 are determined to be sufficiently cool.

Figure 11:
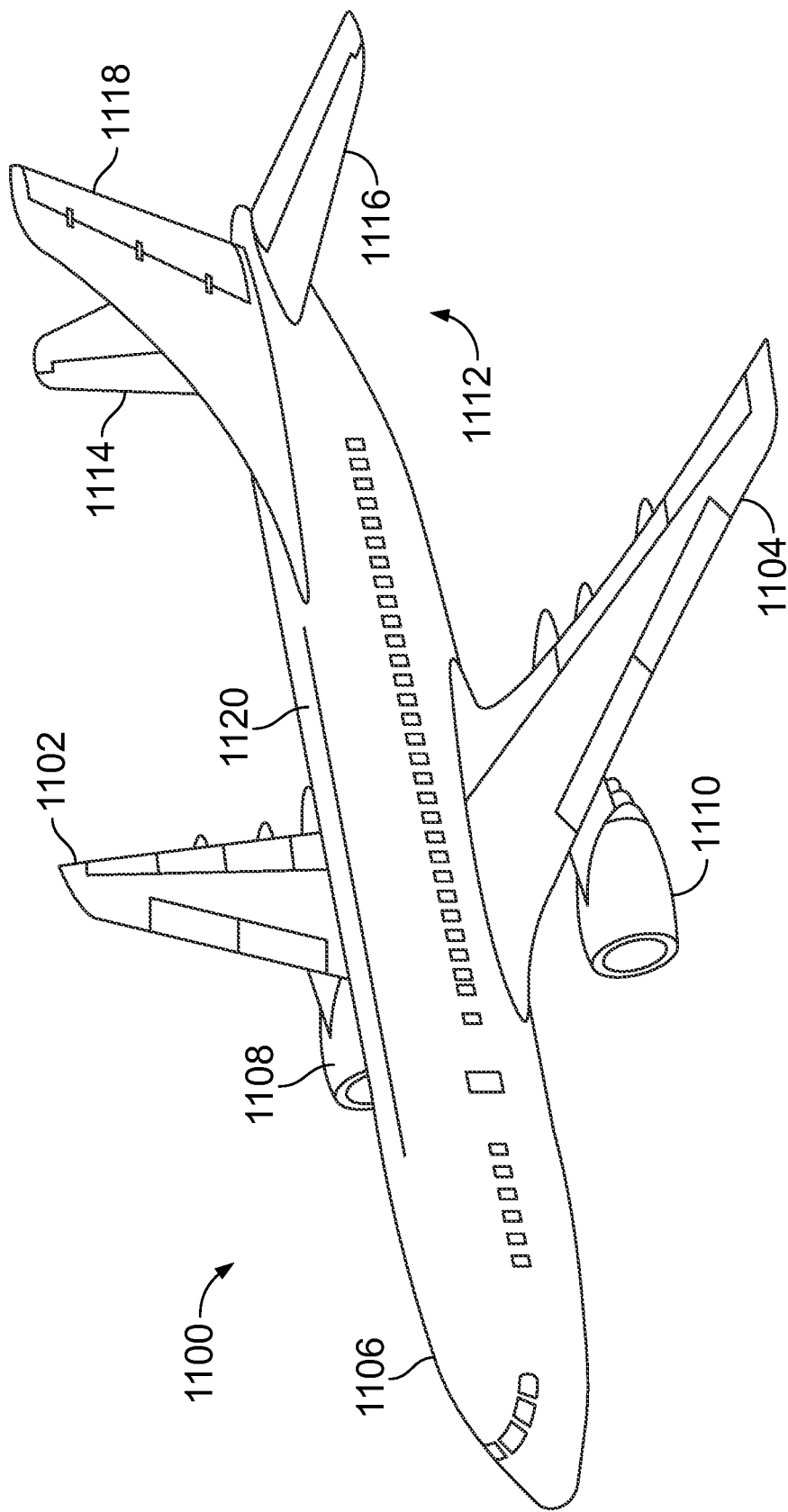
FIG. 11 illustrates a schematic perspective view of an aircraft including one or more processing devices described herein according to various implementations of the present disclosure.

FIG. 11 illustrates a schematic perspective view of an aircraft having one or more portions controlled by a processing device stored and cooled in a mil-aero conduction cooling chassis as described herein. The aircraft 1200 includes a wing 1102 and a wing 1104 attached to a body 1106. The aircraft 1100 also includes an engine 1108 attached to the wing 1102 and an engine 1110 attached to the wing 1104. The body 1106 has a tail section 1112 with a horizontal stabilizer 1114, a horizontal stabilizer 1116, and a vertical stabilizer 1118 attached to the tail section 1112 of the body 1106. The body 1106 in some implementations has a composite skin 1120.

The aircraft 1100 is an example of an aircraft 1100 including one or more components controlled by the processing device 800 mounted in the mil-aero conduction cooling chassis 900 described herein. For example, various software and software applications executed by the aircraft 1100 can be controlled by the one or more processing devices 800.

The illustration of the aircraft 1200 is not meant to imply physical or architectural limitations to the manner in which an illustrative configuration may be implemented. For example, although the aircraft 1200 is a commercial aircraft, the aircraft 1200 can be a military aircraft, a rotorcraft, a helicopter, an unmanned aerial vehicle, or any other suitable aircraft. Other vehicles are possible as well, such as, for example but without limitation, an automobile, a motorcycle, a bus, a boat, a train, or the like.

The following clauses describe further aspects of the present disclosure. In some implementations, the clauses described below can be further combined in any subcombination without departing from the scope of the present disclosure.

Clause Set A:

A1: A heat frame, comprising:
a plurality of fins; and
at least one heat pipe extending through a hole provided in each of the plurality of fins,
wherein the heat frame is coupled to a cooling chassis.

A2: The heat frame of A1, wherein the plurality of fins are provided parallel to the cooling chassis.

A3: The heat frame of A1, wherein the plurality of fins are comprised of at least one of copper or aluminum.

A4: The heat frame of A1, wherein the at least one heat pipe is configured to contain a gaseous material configured to cool a processing device connected to the heat frame.

A5: The heat frame of A1, wherein:
the plurality of fins extend in a first direction parallel to the cooling chassis, and
the at least one heat pipe is provided in a second direction perpendicular to the first direction.

A6: The heat frame of A5, wherein the at least one heat pipe is configured to cool air flowing in the first direction.

A7: The heat frame of A1, wherein:
the heat frame is coupled to a processing module, and
a junction of the heat frame and the processing module is provided at a slot in the cooling chassis.

Clause Set B:

B1: A processing device, comprising:
a processing module; and
a first heat frame coupled to a first side of the processing module,
a second heat frame coupled to a second side of the processing module,
wherein each of the first heat frame and the second heat frames comprises:
a plurality of fins, each fin of the plurality of fins including at least one hole, wherein each fin of the plurality of fins is parallel to every other fin; and
at least one heat pipe extending through the hole provided in each of the plurality of fins.

B2: The processing device of B1, wherein the first side is opposite of the second side.

B3: The processing device of B1, further comprising:
a heat frame connecting portion coupled to each of the first heat frame and the second heat frame,
wherein the heat frame connecting portion is provided on a third side of the processing module.
at least one ejector handle configured to remove the processing module from a connecting point.

B4: The processing device of B3, wherein the processing module further comprises:
a connector configured to connect the processing module to a conduction cooling chassis,
wherein the connector is provided on a fourth side of the processing module, opposite the third side.

B5: The processing device of B4, wherein the heat frame connecting portion further comprises:
at least one ejector handle configured to release the connector from the conduction cooling chassis.

Clause Set C:

C1: A conduction cooling chassis, comprising:
a processing device, comprising:
a first heat frame,
a second heat frame, and
a processing module provided between the first heat frame and the second heat frame;

a first cooling chassis and a second cooling chassis, each of the first cooling chassis and the second cooling chassis comprising:
   a first wall,
   a second wall, and
   a slot provided between the first wall and the second wall, wherein a junction between the first heat frame and the processing module is provided in the slot of the first cooling chassis and a junction between the second heat frame and the processing module is provided in the slot of the second cooling chassis.

C2: The conduction cooling chassis of C1, wherein each of the first heat frame and the second heat frame comprises:
   a plurality of fins, each fin of the plurality of fins including at least one hole, wherein each fin of the plurality of fins is parallel to every other fin; and
   at least one heat pipe extending through the hole provided in each of the plurality of fins.

C3: The conduction cooling chassis of C2, further comprising:
   a first internal fixed chassis frame provided adjacent to the first heat frame, and
   a second internal fixed chassis frame provided adjacent to the second heat frame.

C4: The conduction cooling chassis of C3, further comprising:
   a rail clamp assembly including:
   a first rail clamp provided on the first cooling chassis, the first rail clamp including a first fastener,
   a second rail clamp provided on the second cooling chassis, the second rail clamp including a second fastener, and
   a bridge provided between the first rail clamp and the second rail clamp.

C5: The conduction cooling chassis of C4, wherein:
   the first fastener and the second fastener are configured to provide an inward pressure on the bridge, and
   the inward pressure causes the first cooling chassis to move toward the first internal fixed chassis frame and the second cooling chassis to move toward the second internal fixed chassis frame.

C6: The conduction cooling chassis of C3, further comprising:
   a first external fixed chassis frame provided adjacent to the first cooling chassis, wherein the first cooling chassis is provided between the first external fixed chassis frame and the first internal fixed chassis frame;
   a first space between the first cooling chassis and the first external fixed chassis frame;
   a second external fixed chassis frame provided adjacent to the second cooling chassis, wherein the second cooling chassis is provided between the second external fixed chassis frame and the second internal fixed chassis frame; and
   a second space between the second cooling chassis and the second external fixed chassis frame.

C7: The conduction cooling chassis of C6, wherein:
   the first external fixed chassis frame includes a first air duct configured to enable airflow to the first space; and
   the second external fixed chassis frame includes a second air duct configured to enable airflow to the second space.

C8: The conduction cooling chassis of C7, wherein:
   the airflow in the first space is configured to cool the plurality of fins of the first heat frame,
   the airflow in the second space is configured to cool the plurality of fins of the second heat frame, and the cooled plurality of fins of the first heat frame and the cooled plurality of fins of the second heat frame is configured to cool the processing module.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

It will be understood that the benefits and advantages described above may relate to one implementation or may relate to several implementations. The implementations are not limited to those that solve any or all of the stated problems or those that have any or all of the stated benefits and advantages. It will further be understood that reference to 'an' item refers to one or more of those items.

The term "comprising" is used in this disclosure to mean including the feature(s) or act(s) followed thereafter, without excluding the presence of one or more additional features or acts.

In some implementations, the operations illustrated in the figures may be implemented as software instructions encoded on a computer readable medium, in hardware programmed or designed to perform the operations, or both. For example, aspects of the disclosure may be implemented as an ASIC, SoC, or other circuitry including a plurality of interconnected, electrically conductive elements.

The order of execution or performance of the operations in implementations of the disclosure illustrated and described herein is not essential, unless otherwise specified. That is, the operations may be performed in any order, unless otherwise specified, and implementations of the disclosure may include additional or fewer operations than those disclosed herein. For example, it is contemplated that executing or performing a particular operation before, contemporaneously with, or after another operation is within the scope of aspects of the disclosure.

When introducing elements of aspects of the disclosure or the examples thereof, the articles "a," "an," "the," and "said" are intended to mean that there are one or more of the elements. The terms "comprising," "including," and "having" are intended to be inclusive and mean that there may be additional elements other than the listed elements. The term "exemplary" is intended to mean "an example of." The phrase "one or more of the following: A, B, and C" means "at least one of A and/or at least one of B and/or at least one of C."

Having described aspects of the disclosure in detail, it will be apparent that modifications and variations are possible without departing from the scope of aspects of the disclosure as defined in the appended claims. As various changes could be made in the above constructions, products, and methods without departing from the scope of aspects of the disclosure, it is intended that all matter contained in the above description and shown in the accompanying drawings shall be interpreted as illustrative and not in a limiting sense.

It is to be understood that the above description is intended to be illustrative, and not restrictive. As an illustration, the above-described implementations (and/or aspects thereof) are usable in combination with each other. In addition, many modifications are practicable to adapt a particular situation or material to the teachings of the various implementations of the disclosure without departing from their scope. While the dimensions and types of materials described herein are intended to define the parameters of the various implementations of the disclosure, the implementations are by no means limiting and are exemplary implementations. Many other implementations will be apparent to those of ordinary skill in the art upon reviewing the above description. The scope of the various implementations of the disclosure should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, the terms "first," "second," and "third," etc. are used merely as labels, and are not intended to impose numerical requirements on their objects. Further, the limitations of the following claims are not written in means-plus-function format and are not intended to be interpreted based on 35 U.S.C. § 112(f), unless and until such claim limitations expressly use the phrase "means for" followed by a statement of function void of further structure.

This written description uses examples to disclose the various implementations of the disclosure, including the best mode, and also to enable any person of ordinary skill in the art to practice the various implementations of the disclosure, including making and using any devices or systems and performing any incorporated methods. The patentable scope of the various implementations of the disclosure is defined by the claims, and includes other examples that occur to those persons of ordinary skill in the art. Such other examples are intended to be within the scope of the claims if the examples have structural elements that do not differ from the literal language of the claims, or if the examples include equivalent structural elements with insubstantial differences from the literal language of the claims.

Although the present disclosure has been described with reference to various implementations, various changes and modifications can be made without departing from the scope of the present disclosure.

What is claimed is:

1. A heat frame for a processing device, comprising:
   a plurality of fins; and
   at least one heat pipe extending through a hole provided in each of the plurality of fins, wherein the heat frame is to extend from a processing module and is coupled to a cooling chassis, and wherein the cooling chassis includes at least one cooling wall extending perpendicularly from the heat frame between the plurality of fins and the processing module.

2. The heat frame of claim 1, wherein the plurality of fins are provided parallel to the cooling chassis.

3. The heat frame of claim 1, wherein the plurality of fins are comprised of at least one of copper or aluminum.

4. The heat frame of claim 1, wherein the at least one heat pipe is configured to contain a gaseous material configured to cool a processing module connected to the heat frame.

5. The heat frame of claim 1, wherein:
   the plurality of fins extend in a first direction parallel to the cooling chassis, and
   the at least one heat pipe is provided in a second direction perpendicular to the first direction.

6. The heat frame of claim 5, wherein the at least one heat pipe is configured to cool air flowing in the first direction.

7. The heat frame of claim 1, wherein:
   the heat frame is coupled to the processing module, and
   a junction of the heat frame and the processing module is provided at a slot in the cooling chassis.

8. A processing device, comprising:
   a processing module;
   a first heat frame coupled to and extending from a first side of the processing module; and
   a second heat frame coupled to and extending from a second side of the processing module,
   wherein each of the first heat frame and the second heat frame is to couple to a cooling chassis, and wherein each of the first heat frame and the second heat frame comprises:
      a plurality of fins, each fin of the plurality of fins including at least one hole, wherein each fin of the plurality of fins is parallel to every other fin; and
      at least one heat pipe extending through the hole provided in each of the plurality of fins,
      wherein a portion of the cooling chassis is positioned between each of the plurality of fins and the processing module, and the portion of the cooling chassis extends perpendicular from each of the first heat frame and the second heat frame.

9. The processing device of claim 8, wherein the first side of the processing module is opposite of the second side of the processing module.

10. The processing device of claim 8, further comprising:
    a heat frame connecting portion coupled to each of the first heat frame and the second heat frame, wherein the heat frame connecting portion is provided on a third side of the processing module.

11. The processing device of claim 10, wherein the processing module further comprises:
    a connector configured to connect the processing module to a conduction cooling chassis,
    wherein the connector is provided on a fourth side of the processing module, opposite the third side.

12. The processing device of claim 11, wherein the heat frame connecting portion further comprises:
    at least one ejector handle configured to release the connector from the conduction cooling chassis.

13. A conduction cooling chassis, comprising:
    a processing device, comprising:
       a first heat frame,
       a second heat frame,
          wherein each of the first heat frame and the second heat frame comprises a plurality of fins and at least one heat pipe coupled to the plurality of fins, and
       a processing module provided between the first heat frame and the second heat frame, wherein the first heat frame extends from a first side of the processing module and the second heat frame extends from a second side of the processing module;
    a first cooling chassis and a second cooling chassis, each of the first cooling chassis and the second cooling chassis comprising:
       a first wall,
       a second wall, and
       a slot provided between the first wall and the second wall, wherein a junction between the first heat frame and the processing module is provided in the slot of the first cooling chassis and a junction between the second heat frame and the processing module is provided in the slot of the second cooling chassis;
    wherein each of the first wall and the second wall of each of the first cooling chassis and the second cooling chassis extends perpendicular from each of the first heat frame and the second heat frame.

14. The conduction cooling chassis of claim 13, wherein each of the first heat frame and the second heat frame comprises:

the plurality of fins, each fin of the plurality of fins including at least one hole, wherein each fin of the plurality of fins is parallel to every other fin; and at least one heat pipe extending through the hole provided in each of the plurality of fins.

15. The conduction cooling chassis of claim 14, further comprising:
   a first internal fixed chassis frame provided adjacent to the first heat frame, and
   a second internal fixed chassis frame provided adjacent to the second heat frame.

16. The conduction cooling chassis of claim 15, further comprising:
   a rail clamp assembly including:
      a first clamp provided on the first cooling chassis, the first clamp including a first fastener,
      a second clamp provided on the second cooling chassis, the second clamp including a second fastener, and
      a bridge provided between the first clamp and the second clamp.

17. The conduction cooling chassis of claim 16, wherein:
   the first fastener and the second fastener are configured to provide an inward pressure on the bridge, and
   the inward pressure causes the first cooling chassis to move toward the first internal fixed chassis frame and the second cooling chassis to move toward the second internal fixed chassis frame.

18. The conduction cooling chassis of claim 15, further comprising:
   a first external fixed chassis frame provided adjacent to the first cooling chassis, wherein the first cooling chassis is provided between the first external fixed chassis frame and the first internal fixed chassis frame;
   a first space between the first cooling chassis and the first external fixed chassis frame;
   a second external fixed chassis frame provided adjacent to the second cooling chassis, wherein the second cooling chassis is provided between the second external fixed chassis frame and the second internal fixed chassis frame; and
   a second space between the second cooling chassis and the second external fixed chassis frame.

19. The conduction cooling chassis of claim 18, wherein:
   the first external fixed chassis frame includes a first air duct configured to enable airflow to the first space; and
   the second external fixed chassis frame includes a second air duct configured to enable airflow to the second space.

20. The conduction cooling chassis of claim 19, wherein:
   the airflow in the first space is configured to cool the plurality of fins of the first heat frame,
   the airflow in the second space is configured to cool the plurality of fins of the second heat frame, and
   the cooled plurality of fins of the first heat frame and the cooled plurality of fins of the second heat frame is configured to cool the processing module.

* * * * *